HIGH POWER SYNTHETIC WAVEFORM GENERATOR

Filed Nov. 3, 1959 4 Sheets-Sheet 1

INVENTORS
JAMES A. ROSS
JOSEPH W. HARTER, 3rd
BY
Harry R. Lubcke
AGENT

Aug. 13, 1963 J. A. ROSS ET AL 3,100,851

HIGH POWER SYNTHETIC WAVEFORM GENERATOR

Filed Nov. 3, 1959 4 Sheets-Sheet 2

INVENTORS
JAMES A. ROSS
JOSEPH W. HARTER, 3rd

BY Harry R. Lubcke
AGENT

INVENTORS
JAMES A. ROSS
BY JOSEPH W. HARTER, 3rd
Harry R. Lubcke
AGENT

Aug. 13, 1963 J. A. ROSS ETAL 3,100,851

HIGH POWER SYNTHETIC WAVEFORM GENERATOR

Filed Nov. 3, 1959 4 Sheets-Sheet 4

INVENTORS
JAMES A. ROSS
JOSEPH W. HARTER, 3rd

BY Harry R. Lubcke

AGENT

United States Patent Office 3,100,851
Patented Aug. 13, 1963

3,100,851

HIGH POWER SYNTHETIC WAVEFORM GENERATOR

James A. Ross, Orange, and Joseph W. Harter 3rd, Venice, Calif., assignors to Ling-Temco-Vought, Inc., Dallas, Tex., a corporation of Delaware Filed Nov. 3, 1959, Ser. No. 850,595
24 Claims. (Cl. 307—107)

Our invention relates to an electrical device for synthesizing alternating electrical energy from non-alternating electrical energy, and particularly to an aperiodic device for accomplishing this process under low power control.

A high power electrical amplifier consists of means to control a large amount of so-called direct current or constant-polarity electric power by a relatively small amount of control alternating current power impressed upon the input. Such amplifiers control the large amount of electrical power by an essentially variable resistance effect that takes place in the vacuum tube or tubes of the amplifier. What power is not passed on to the load during periods of low power output is dissipated in the vacuum tubes, particularly at the anodes thereof. Accordingly, effective cooling means are required to take away the resulting heat, else the amplifier soon destroys itself. In a class B amplifier the maximum theoretical efficiency is 78 percent. When the power capability of the amplifier is, say, 90 kilowatts, the power dissipated is considerable. It precludes placing the amplifier in a small space in a constricted environment.

We have been able to increase this efficiency to the order of 99 percent by employing controlled rectifier means such as to constitute switches to turn local electrical energy of fixed voltage levels on and off as desired, rather than to employ vacuum tubes as variable resistors. It will be appreciated that the dissipation in the switching rectifiers is only a very small amount and is determined by the small forward resistance of these devices. The resulting waveform is formed of a number of successive rectangular increments. The approximation to a sinusoidal or to other desired waveforms is reasonably close and the approximation of the current that flows in the usual electrical load is even closer. The shape of the waveform synthesized depends upon the control routine of the several rectifiers.

While this general plan of our high power "amplifier" will be readily understood, further consideration reveals that means are required to turn off the successive rectifiers in order that the decreasing amplitude of a sine waveshape, for example, can be formed. This we have been able to accomplish in either of two relatively simple and automatic ways. An inductive-capacitance "kicker" circuit is provided in each of the typical controlled rectifier circuits, or its equivalent in a computer-like control circuit in an alternate embodiment of our invention.

Considering first the kicker circuit, it will be understood that a controlled rectifier, such as a thyratron or its new semiconductor equivalent, can be placed into conduction by a pulse upon the control electrode thereof, but that a back voltage sufficiently high to exceed the forward working voltage must be impressed upon the cathode thereof for a time sufficiently long to allow the rectifier to "deionize" if conduction is to cease. In our circuit the electrical energy stored in the inductor when the next lower voltage rectifier was passing current is stored in the capacitor thereof when that level rectifier was keyed off. An ordinary diode is inserted between the voltage source and the inductor-capacitor combination so that the capacitor cannot discharge back through the source. The time constant of the inductor-capacitor combination is made sufficiently large so that the voltage pulse created by charging the capacitor is greater than the voltage of the electrical energy source connected to the next higher voltage controlled rectifier. When the lower voltage controlled rectifier is triggered on for the voltage decrease portion of the desired waveshape the voltage stored in the capacitor reaches the higher voltage controlled rectifier and back biases it. That is, the voltage on the cathode thereof is more positive than the voltage on the anode thereof supplied by the power source. This causes this rectifier to cease conducting and the charge on the capacitor is sufficient to maintain the back bias until this rectifier de-ionizes. When the charge on the capacitor is exhausted the higher voltage controlled rectifier will not again conduct since a pulse to the control electrode thereof is not supplied to turn it on. The next lower voltage step controlled rectifier continues to conduct and to supply the working current to the load until it too is turned off through kicker action when the next lower voltage step controlled rectifier receives a control pulse and so on down in voltage steps as required.

In the alternate embodiment a group of switch cores suitably distribute a common control pulse so that the controlled rectifier to be shut off is similarly back-biased sufficiently long to become and remain non-conducting.

By these means we are able to use one set of controlled rectifiers for both going upward toward increasing amplitudes on a waveform and also for coming downward toward decreasing amplitudes.

We are able to hasten the inductor-capacitor control recited above by placing a still further diode across the inductor. Also, the capacitor of the combination can be connected to the opposite (higher) voltage terminal of that portion of the source of electrical energy in acting in the kicker function and thus effect a reduction in electrical size of the inductor and capacitor. Furthermore, a Zener diode placed across the capacitor (with appropriate associated elements) limits the kicker pulse to a uniform voltage in practical operation.

In the conventional electronic amplifier a low energy of the waveform it is desired to reproduce is introduced at the input. In the present invention we employ only low energy electrical pulses. These pulses are properly timed to inaugurate the next required event. The apparatus has the information within itself to carry on between the events.

For inaugurating events in our first embodiment uniformly shaped and uniformly recurring pulses are distributed to the several controlled rectifiers by a counter, such as a ring or a binary counter.

In our second embodiment the same function is accomplished by providing a similar source of pulses, delay means, and a group of switch cores suitably connected to the controlled rectifiers. In many applications it is desired to synthesize a high power sine waveshape from a direct current power source and the switch cores are connected accordingly. Should another waveform be desired our device is differently "programmed" by arranging a different set of connections between switch cores and controlled rectifiers. Such changes in program can be accomplished by a simple plug and jack system or by employing punched cards and a simple punched card reader to transmit the appropriate electrical commands to the control electrodes of the controlled rectifiers.

An object of our invention is to provide a high efficiency synthesizer of alternating electrical energy from a source of non-alternating electrical energy.

Another object is to provide a high power aperiodic pulse-controlled amplifier.

Another object is to pass an essentially sinusoidal waveshape of electric current through a load by pulse-controlling controllable rectifiers which are connected to a direct current source of power.

Another object is to provide a kicker circuit for automatically extinguishing controlled rectifier conduction.

Another object is to produce alternating electrical energy of selected waveshape by suitably programming a control circuit.

Another object is to enhance the power handling capabilities of a waveform synthesizing device cascading of controlled rectifiers.

Other objects will become apparent upon reading the following detailed specification and upon examining the accompanying drawings, in which by way of example are set forth certain embodiments of our invention:

Figure 3:
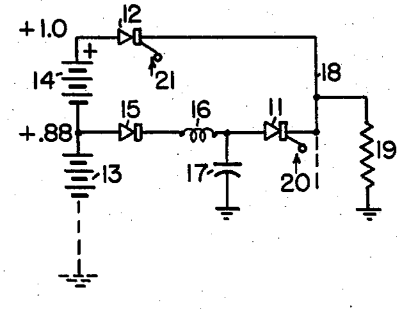
Figure 4:
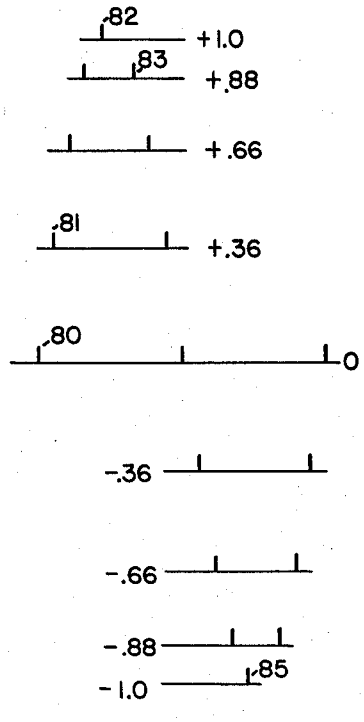
Figure 5:
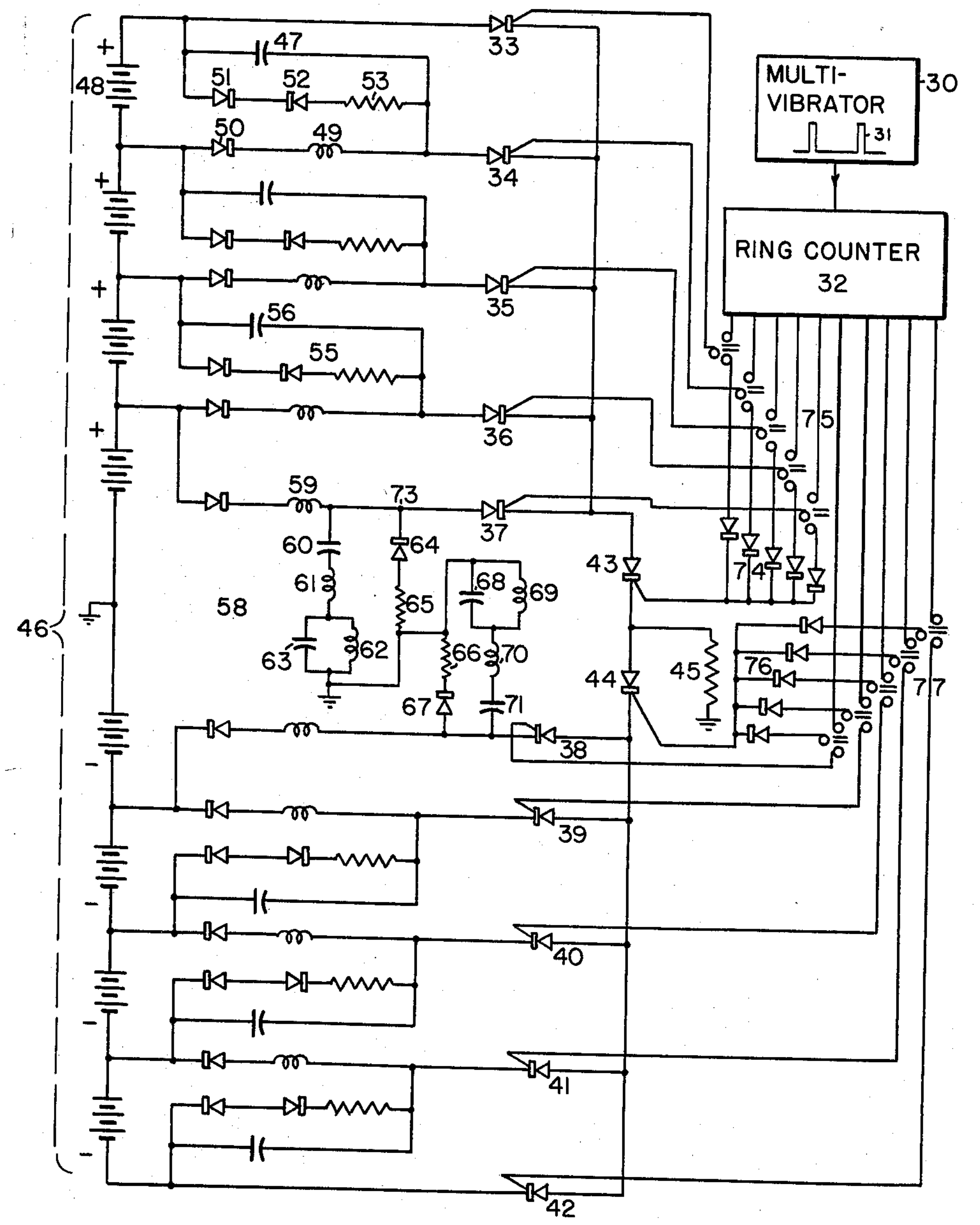
Figure 7:
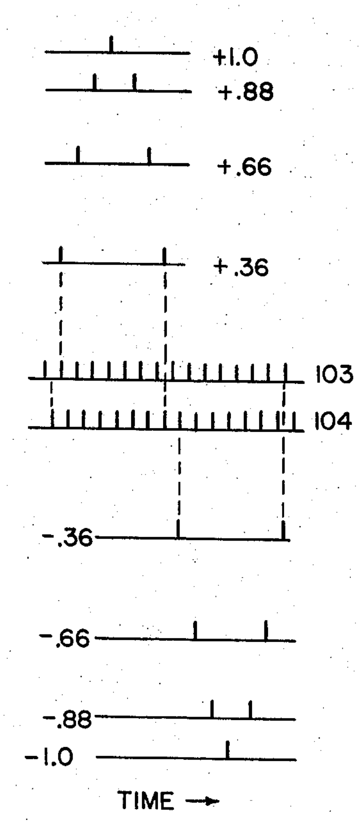
Figure 6:
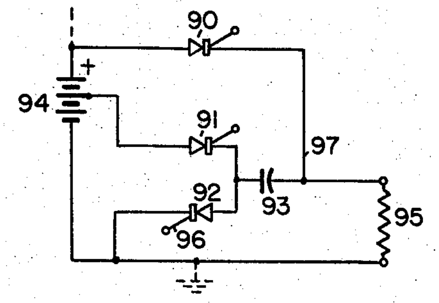
Figure 9:
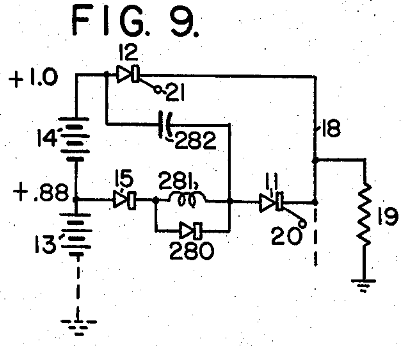
Figure 8:
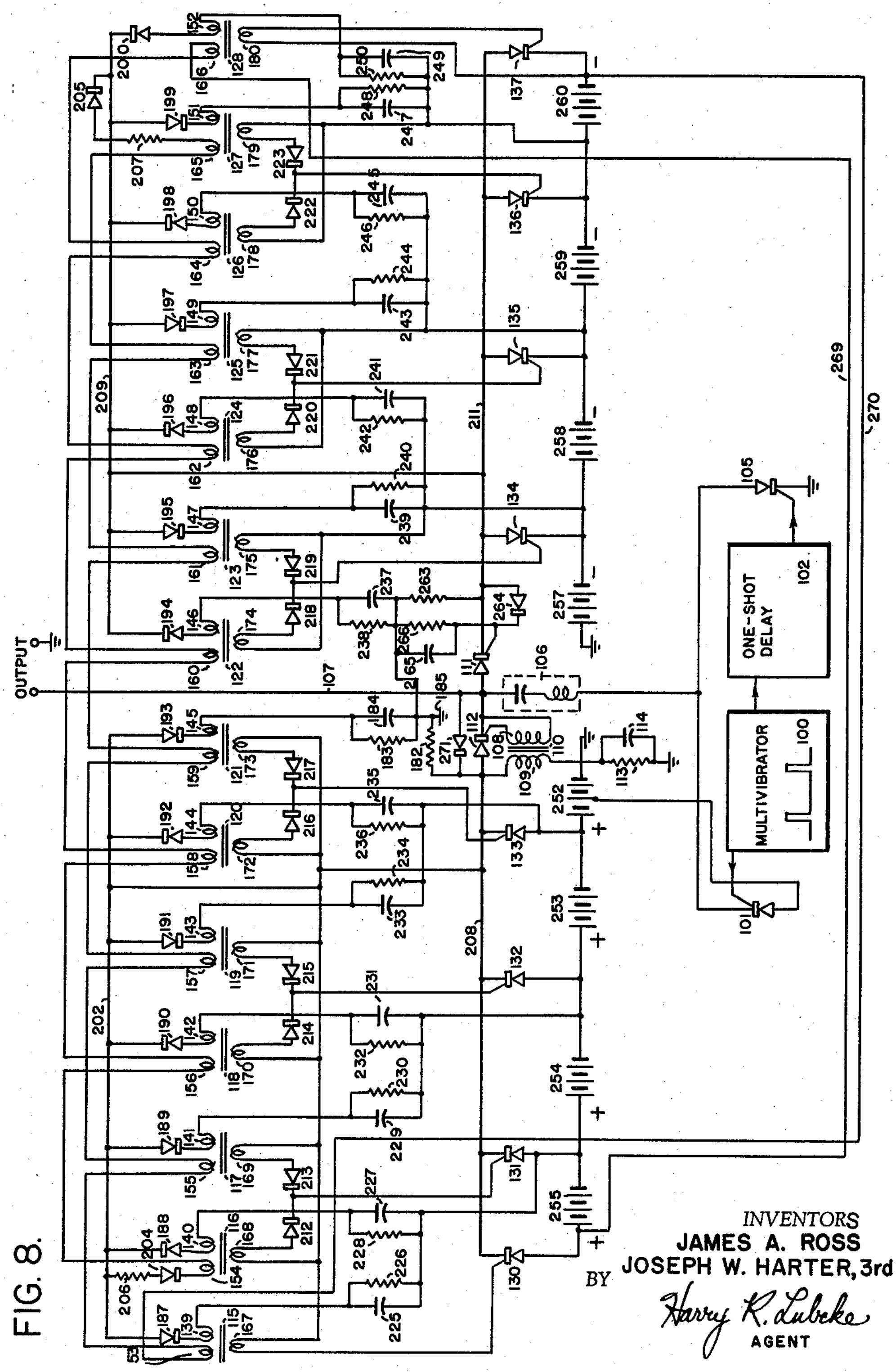

FIG. 3 shows a basic fragmentary circuit of our device, particularly as concerns the kicker method of halting current flow, FIG. 4 shows a timing detail for sine wave control pulses, FIG. 5 shows a complete schematic circuit of one embodiment of our synthesizer, FIG. 6 shows an alternate fragmentary circuit diagram of a second embodiment of our invention, FIG. 7 shows the timing detail of a second embodiment of our invention, FIG. 8 shows a complete schematic circuit of our second overall embodiment, and FIG. 9 shows a further alternate fragmentary circuit diagram concerned with the first embodiment of our invention.

Figure 1:
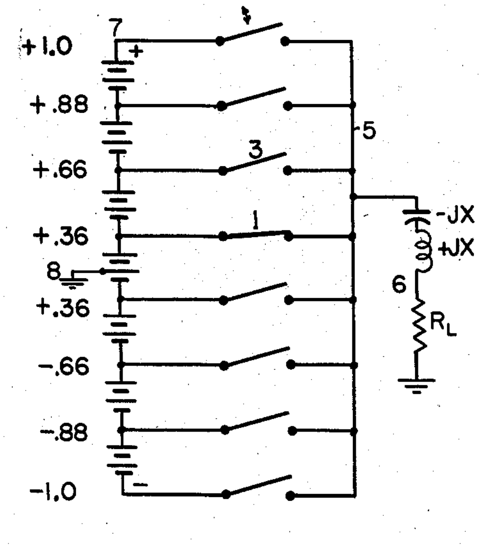
FIG. 1 shows a simplified switch exemplification of our device.

FIG. 1 is a greatly simplified representation of our invention, included to show that by an appropriate manipulation of switches an alternating current waveform can be synthesized from a plurality of direct current electrical energy sources of different voltages. The device of FIG. 1 contemplates the closing and opening of the various switches by hand as the equivalent of the functioning of controlled rectifiers at low frequencies of operation.

Figure 2:
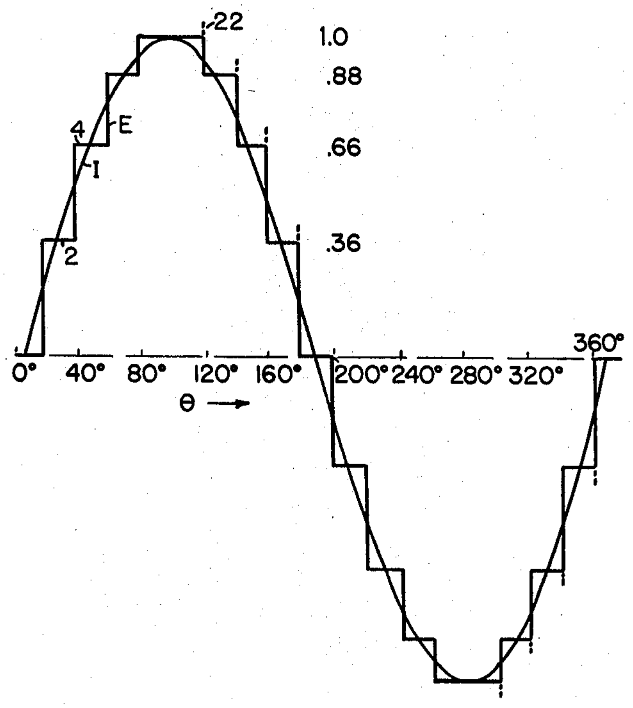
FIG. 2 shows how a quasi-sine wave is synthesized in our apparatus.

It is evident from FIG. 2 that when appropriate invariable voltages are established by batteries or otherwise, such as 0.36, 0.66, 0.88 and 1.0 (times any desired voltage, say 100 volts), and these voltages are altered from one to the next value in increasing and decreasing magnitude in equal increments of time, the result is essentially a sinusoidal waveshape.

In FIG. 1 only one of the several switches is closed at any one time, say switch 1. This corresponds to the voltage level 2 in FIG. 2. This level, at voltage 0.36 of maximum, persists for an interval of 20 electrical degrees as referenced to a full cycle of alternating voltage and/or current of 360°. Thereafter, switch 1 is opened and switch 3 immediately closed. This provides the step for 20° more time at a voltage amplitude of 0.66 maximum, and so on.

The result of this sequential behavior is a stepped sinusoid of voltage on output bus 5. The latter is connected to load 6, which has been generalized to have capacitative reactance −JX, inductive reactance +JX and resistance $R_L$. If the load be a transducer, such as a loudspeaker, the impedance would be largely inductive and resistive. If the loudspeakers or loudspeaker are operated at resonance, as in sonar, the impedance is resistive, except for the important transient conditions occurring at the start and the stop of the tone pulse.

The voltage (and power) source for each step is provided in FIG. 1 by battery 7. This has a low internal impedance, is grounded at center tap 8 and has opposite polarity as connected to the switches on opposite sides of ground.

The above idealistic embodiment of our invention becomes eminently practical through the use of controlled semiconductor diodes, such as shown at 11 and 12 in

12 in FIG. 3. Other controllable switches, such as grid controlled thyratrons, etc., may be used, but the controlled silicon rectifier recently made available to the art has the advantages of exceedingly small voltage drop in the forward (conducting) direction of current flow, very rapid de-ionization time and small size.

In the example of FIG. 3 only the 0.88 and the 1.0 levels of FIG. 1 have been reproduced, since the functioning occuring between two such levels is repeated for other pairs of levels. Tapped battery section 13 supplies the 0.88 voltage level and in combination with section 14 the 1.0 voltage level is supplied. It is to be understood that these voltage sources may be batteries, as might be available in a submarine, an airplane or on land; they may be banks of sun cells; or the rectifier-filter power supplies known to the usual electronics art. While we believe our invention has a maximum advantage over prior art devices at large powers in the multi-kilowatt ranges, it will be understood that it will function in all ranges including the microwatt range. The output frequency can be varied by merely varying the repetition rate of the control pulses.

Ordinary (preferably semiconductor) diode 15 is connected with anode to the 0.88 voltage junction between battery sections 13 and 14. The cathode of the diode is connected to a small inductor 16. This may have an inductance of the order of one millihenry, but must be capable of carrying the current (amperes) that flows through this step when it is in operation. Capacitor 17 connects from the junction between inductor 16 and controlled diode 11 to a constant potential, shown as ground in FIG. 3, and may have a capacitance of 175 microfarads. It will be understood that these specific circuit values are given by way of example, to more easily enable comprehension of our invention by those skilled in the art, but that wide departures may be taken therefrom without departing from our inventive concept.

The circuit of the 0.88 voltage step is completed through controlled diode 11, output bus 18 and load 19, to a reference potential, normally ground. Controlled diode 12 anode is connected to the maximum potential of battery section 14 and the cathode to bus 18.

In examining the functioning of the apparatus of FIG. 3, consider first the instant of time in which, in FIG. 2, the voltage is increasing from plus 0.88 to plus 1.0. At a prior instant the control electrode 20 of controlled rectifier 11 has been given a positive pulse (from means not shown in FIG. 3) and that this rectifier has been conducting from phase time 60° to phase time 80°. At time 80° a positive pulse is impressed upon control electrode 21 of controlled rectifier 12, causing this rectifier to conduct.

It is understood from first principles that whether or not a pulse is impressed upon the control electrode of a controlled rectifier it will not conduct if the cathode potential is greater than the anode potential. This is not the situation with controlled rectifier at time 80°, since the voltage at the anode (connected to battery section 14) is plus 1.0, while the voltage upon bus 18 (due to the existing conduction of controlled rectifier 11) is only plus 0.88. These voltage values are relative, of course. In practice, voltage plus 1.0 may be 200 volts. With a load impedance of 4 ohms, resistive, the peak power of the alternating current wave is 10 kilowatts.

However, when controlled rectifier 12 is triggered on and conducts, the voltage of bus 18 is raised in voltage from 0.88 to 1.0. This is greater than the voltage of battery section 13, and so controlled rectifier 11 is back-biased. That is, the cathode thereof is at a voltage of 1.0 while the anode is at a voltage of only 0.88. Accordingly, conduction through controlled rectifier 11 ceases. In this manner the several steps of increasing amplitude are formed in the waveform of FIG. 2 from time 0 to time 90°.

In order to shut the controlled rectifiers off in the steps of decreasing amplitude from time 90° to 180°, another mechanism must be brought into play. This is concerned with elements 15, 16 and 17 in FIG. 3.

While the controlled rectifier 11 was conducting on the rise of the waveform, current was flowing through inductor 16. When this current was stopped by back-bias, as has been described, the electrical inertia of inductance caused the current to continue to flow for a brief period. Since controlled rectifier 11 was shut off (non-conducting), this current could not flow anywhere other than into capacitor 17. This flow raises the potential of that capacitor over that obtaining when the receifier 11 was conducting. With the values given we have found that this increase in potential is about 10 volts greater than the potential at step 1.0 (i.e., 200 v. +10 v.=210 v.). Since this potential exists at the anode (the arrow point part of the symbol) of rectifier 11, at any time that we wish we can trigger that rectifier into conduction again. This charge remains on the capacitor because ordinary diode 15 is back-biased; that is, 210 volts is impressed upon the cathode while only 0.88×200 v.=176 v. is present on the anode (from battery section 13).

Accordingly, at time 110° (identified by numeral 22 in FIG. 2), we trigger controlled rectifier 11 by introducing a trigger pulse upon control electrode 20 thereof. This trigger pulse is derived from the timing means previously mentioned. Rectifier 11 is thus immediately brought into conduction and because of the higher voltage initially present on capacitor 17 a "spike" of voltage 22 exists for a very brief duration. This duration is long enough, however, to back-bias controlled rectifier 12. The voltage on output bus 18 becomes 210 v. while the voltage on the anode of this rectifier is only 200 v., from battery section 14. Available controlled rectifiers have a turn-off time ("de-ionization" time) of the order of 10 to 20 microseconds. The duration of the voltage spike is safely longer than this and so rectifier 12 is turned off and remains so until another trigger pulse occurs at time 80° on the next positive half wave cycle.

This structure and functioning is an important aspect of our invention, in that it allows one set of controlled rectifiers to function in forming both the rise and the fall of each alternating half wave, as the half of the sinusoidal waveshape employed as the example. Since the controlled rectifiers are the most expensive and functionally important elements in the apparatus, a reduction of the number required is a desirable simplification.

In the manner sketched in FIG. 1 the structure of FIG. 3 is repeated in practice from voltage source plus 1.0 to minus 1.0, and the mechanism described for turning the rectifiers on for increasing amplitude of voltage, of either positive or negative polarity as per FIG. 2, and for turning the rectifiers off by our "kicker" functioning for decreasing amplitude of voltage, or either positive or negative polarity, is employed.

A complete circuit diagram in accordance with the above considerations is shown in FIG. 5 and the timing routine for the same is shown in FIG. 4.

Consider first the timing portion of the circuit, pulse multivibrator 30 provides the source of timing pulses, there being one pulse produced for each time a triggering event is to occur, no matter in what portion of the whole apparatus. This amounts to eighteen times the output frequency desired. Thus, for an output frequency of 500 cycles, the pulse repetition frequency of multivibrator 30 is 9,000 per second. The pulse waveform is sketched at 31, within the rectangular multivibrator block symbol. The pulse duration is not critical, but a duration sufficient to trigger ring counter 32 is required. The leading edge of the pulse accomplishes the triggering. The circuit for the multivibrator merely calls for unequal time constants between the input circuits of each of the two tubes thereof, or equivalent circuitry.

Ring counter 32 provides a means for distributing the pulses from multivibrator 30 to the trigger or control electrode of controlled rectifiers 33 to 42 and also to auxiliary controlled rectifiers 43, 44. Such counter circuits are known and electrically perform the same function as the mechanical distributor on an automobile engine in conveying electrical energy to each spark plug at the correct time. A ring counter consisting of switch cores and diodes is suitable.

As previously described in connection with FIGS. 1 and 2, the pulses in FIG. 5 are distributed first to controlled rectifier 37 in following the offered example of the formation of a sine wave, and then to 36, 35, 34 and 33 in succession. This is accomplished over the conductors shown emerging from the ring counter and connected to each of the controlled rectifiers noted. Additional conductors branching off from each of those just mentioned are seen to connect to the control electrode of controlled rectifier 43 through diodes generally indicated at 74.

Generally indicated at 75 is a group of pulse transformers; one to each connection from the ring counter. A primary winding thereof is connected to the counter in each case. A secondary winding is connected to the control electrode of each controlled rectifier 33—37 and also to the corresponding cathode thereof. Another secondary winding on each pulse transformer, with one of diodes 74 in series, is connected to the control electrode of controlled rectifier 43 and to the cathode thereof.

This causes controlled rectifier 43 to be fired at the same time that any controlled rectifier in the group including rectifiers 33 to 37 are fired. Rectifier 43 is noted as in series with each of the group 33 to 37 with respect to output circuit load 45. It serves to take approximately half of the back voltage drop occurring between the load and the battery power source (indicated generally as 46) when the controlled rectifiers are shut off and thus doubles the power rating of the apparatus with the addition of only one controlled rectifier (i.e., 43).

In the same manner ring counter 32 also triggers controlled rectifiers 38 to 42 in sequence; first to increased negative (absolute) amplitude and secondly through decreasing absolute amplitudes to the zero axis, in each case. Here the auxiliary controlled rectifier is element 44. Diodes 76 feed the controlled electrode thereof from the ring counter and pulse transformers 77 distribute these pulses as described above.

In FIG. 5 the separate steps of the ladder-like structure are essentially the same as previously described in connection with FIG. 3. However, in FIG. 5 an alternate arrangement of capacitors is shown and a Zener diode circuit across the same has been added to limit the "kicker" voltage to an equal amount on each step of the structure.

While capacitor 17 in FIG. 3 was connected to a constant low potential shown as ground from the ladder step with which it coacted, capacitor 47 in FIG. 5 is connected to the next higher step on the ladder; i.e., to the anode of controlled rectifier 33 and at the same time to the maximum positive voltage of the structure provided by battery section 48. This connection has the advantage over that of FIG. 3 of increased voltage reference. That is, in the case of capacitor 17 the potential of 10 volts more than the next higher battery section voltage had to be built up from ground. With capacitor 47, the terminal thereof opposite controlled rectifier 34 is already at the potential of the next higher battery section (i.e., 48) and so to produce the "kicker" voltage it is only necessary to increase this voltage by 10 volts. As before, this is accomplished by an inductor 49 and a diode 50. Because the charge required is smaller with the new arrangement of FIG. 5, the inductance of inductor 49 can be approximately half that of former inductor 16. We have also found that the capacitance of capacitor 47 may be of the order of 150 microfarads as compared to 175 microfarads for capacitor 17.

Zener diode 51 is connected with its anode to the high voltage terminal of battery section 48, which at the same time connects it to the anode of controlled rectifier 33. The cathode of the Zener diode connects to the cathode of an ordinary diode 52. The anode of the latter diode connects in series to resistor 53 and this, in turn, to the second terminal of capacitor 47; i.e., the terminal connecting to inductor 49.

This double-diode-resistor series circuit functions as follows. When the kicker voltage pulse from inductor 49 occurs this charges capacitor 47 and also produces a potential across Zener diode 51. When the Zener voltage is reached, as 10 volts, the Zener diode breaks down. By acting as a shunt for current flow around capacitor 47 it limits the additional voltage across the capacitor to 10 volts. Ordinary diode 52 operates in its conductive (or "forward") direction in this functioning, and thus almost like it was a relatively resistanceless wire conductor. Series resistor 53 is for the purpose of limiting the current in this diode circuit to values safe for the diodes. It has a resistance in the range of from 100 to 1,000 ohms in representative embodiments.

When the kicker voltage is not present across capacitor 47, Zener diode 51 alone would be forward biased and thus would malfunction. It is because of this situation that diode 52 is included. It is back biased under the same conditions and so, in effect, opens this circuit.

It will be noted in FIG. 5 that this structure is repeated for each downward step of the ladder structure and so these will not be repetitively described. A capacitor like 47 is not required in association with the lowest voltage step, that of controlled diode-rectifier 37, because its function is performed by network 60, 61, 62, 63. This network has the added property, in conjunction with inductor 59, of turning off rectifier 37 after a length of time controlled by the network constants.

On the negative side of the structure the elements previously considered are repeated in mirror-image fashion. Controlled rectifier 42 corresponds to rectifier 33, and rectifier 38 to rectifier 37. The inductance values of the inductors (as 49) may differ throughout each side. For the lower steps in the ladder, as the step generally indicated by reference numeral 55, the current flowing therethrough during operation is always less than that flowing through the higher voltage steps, which higher steps are also greater increments. Thus, a larger inductance value is required to charge capacitor 56 to 10 volts higher than its normal potential to form the kicker pulse than is required to charge capacitor 47.

At the central junction of the positive and negative voltage ladders in FIG. 5 certain pulse-forming apparatus, generally referenced by numeral 58, is connected. The energy stored in inductor 59 flows through positive ladder pulse-forming elements comprised of series capacitor 60, series inductor 61 and the parallel connected inductor 62 and capacitor 63. The parallel combination is connected in series with the series combination. The series combination sets the fundamental of the pulse formed and the parallel combination is roughly, not exactly, tuned to the second harmonic thereof. The parallel combination acts to flatten the peak of the pulse to a more or less rectangular shape.

This pulse is conveyed through diode 64, resistor 65, resistor 66 and diode 67 to the first step of the negative ladder; the step having controlled rectifier 38. A second pulse-forming network, having shunt capacitor 68, shunt inductor 69, series inductor 70 and series capacitor 71, is connected in shunt to elements 66, 67, from ground to the cathode of controlled rectifier 38.

Capacitor 60 charges in the same manner as capacitor 47, but it excites the rest of the network when it discharges. After a period of time controlled by the network constants a flywheel effect carries point 73 to a negative voltage, whereupon rectifiers 37 and 43 cease to conduct. Diodes 64 and 67 act to shut off the ladder that has completed its excursion and to bring the potential of load 45 to zero for starting the opposite excursion.

In FIG. 4 the timing pulses produced by multivibrator and distributed by ring counter 32 of FIG. 5, are shown. These have been plotted along abscissa located at the several relative voltage levels to indicate correspondence with the steps of FIG. 2.

The first pulse 80 in FIG. 4 is the one conveyed from the ring counter to controlled rectifier 37 in FIG. 5. The second pulse 81 is that conveyed to controlled rectifier 36, and so on, until pulse 82 activates the most positive controlled rectifier 33. It will be noted that the several pulses in the series 80, 81, 82 are all equally spaced in time along the abscissa, but that a pulse is missing between pulse 82 and the first downward pulse 83. This is to allow a 40° dwell at the top of the sine wave, as shown in FIG. 2. This is accomplished by providing a pulse-producing circuit in the ring counter but not conveying the pulse to any external circuit. The internal pulse fires the next pulse-producing circuit of the counter and this next pulse is conveyed externally, being pulse 83 in FIG. 4. A similar arrangement is employed after the most negative pulse 85.

Excluding the battery source of prime power, or its equivalents to be later considered, it is seen that we are able to produce alternating current waveshapes of relatively high power, in the decakilowatts, with small, light and low heat-producing elements. This is a tremendous advantage over employing motor-generator sets, etc., to accomplish the same purpose. The apparatus of FIG. 5 may be contained in a volume of less than a cubic foot, and having a weight of only a few pounds.

We now pass to a consideration of our main alternate apparatus structure. An illustrative fragmentary circuit is shown in FIG. 6, certain pulse waveforms in FIG. 7 and the complete circuit in FIG. 8.

In FIG. 6 controlled rectifier 90 is the same type of trigger-controlled diode-rectifier previously described and it constitutes the first step in the ladder in the positive direction. Controlled rectifiers 91 and 92, of similar type, are connected in opposite directions as to anode and cathode to a more or less pulse-forming capacitor 93. The anode of rectifier 91 is connected to an intermediate value of step voltage, as plus 50 volts, while the cathode of rectifier 92 is connected to ground. Battery 94 provides the prime source of electric power, the negative terminal of which is connected to ground and the positive terminal to the anode of controlled rectifier 90. The load, or utilization circuit, is represented by resistor 95. This is connected to the cathode of rectifier 90 and the capacitor 93 at one terminal and to ground at the other.

This illustrative circuit operates as follows. Assume that controlled rectifier 90 is in the conducting state. Neither of the other controlled rectifiers 91 and 92 are conducting. Rectifier 92 is fired by a suitable voltage pulse impressed upon control electrode 96. This charges capacitor 93 to the voltage appearing across load 95 at this particular time; i.e., essentially that of battery 94 for this fragmentary circuit. As soon as rectifier 92 has ceased conducting because of insufficient current flow through capacitor 93, etc., controlled rectifier 91 is fired by another voltage pulse that is impressed upon the control electrode thereof. This will raise the potential on its end of capacitor 93 by an amount equal to the anode potential on rectifier 92 and the cathode potential on rectifier 91. This raises the potential on the opposite plate of capacitor 93 also. Thus, the voltage of the output bus 97 has been raised higher than the voltage of step battery 94 and rectifier 90 ceases to conduct. As the capacitor discharges into the load the voltage at the load decreases until it reaches the value where another rectifier can be triggered on, in the general case. In the complete circuit of FIG. 8 a pulse shaping network takes the place of capacitor 93 so that the pulse will be flat-topped and have a very steep trailing edge. This allows high frequency operation, as will later become apparent.

Considering, now, the complete circuit diagram of FIG. 8, multivibrator 100 is the source of repetitive pulses, being roughly equivalent to the previously described multivibrator 30 of FIG. 5. Multivibrator 100 sets the frequency of the output waveform. In the circuit shown the frequency of the output waveform is one-sixteenth that of the pulse repetition rate of the multivibrator.

The output of multivibrator 100 is connected to the control electrode of controlled rectifier 101. A duplicate output of the multivibrator is connected to one-shot delay circuit 102. This circuit employs two triodes with resistance-capacitance relaxation components and an output is taken therefrom to effect a delay of half the period between successive pulses from multivibrator 100. One suitable circuit for this purpose is the monostable multivibrator circuit No. 41 in the National Bureau of Standards preferred circuits book, NAVAER 16–1–519. In FIG. 7 the series of pulses 103 represents the pulses from the multivibrator and the series of pulses 104 the pulses from the delay circuit. It is to be noted that the pulses of one series are staggered in time from the pulses of the other series. The delayed pulses 104 are impressed upon the control electrode of controlled rectifier 105 of FIG. 8.

By the conductors shown the cathode of controlled rectifier 101 and the anode of controlled rectifier 105 are connected to pulse-forming network 106. This is simply represented in FIG. 8 by the fundamental series circuit consisting of a capacitor having a capacitance of the order of 30 microfarads and an inductor having an inductance of the order of 5 microhenries. A more elaborate pulse forming network is comprised of both a series and a parallel section arrangement, as elements 60, 61, 62, 63 of FIG. 5. Values for these latter elements may be 6 microfarads for capacitor 60, 9 microhenries for inductor 61, 3 microhenries for paralleled inductor 62 and 3 microfarads for paralleled capacitor 63. If desired, further parallel sections may be added in series, each tuned to approximately a higher harmonic of the original series circuit frequency, as has been previously explained. A pulse-forming network for forming a 20 microsecond pulse is what is desired for this specific embodiment. Additional parallel sections give steep sides to the pulse and this results in a higher maximum operating frequency.

Pulse 22 in FIG. 2 is illustrative of the 20 microsecond pulse mentioned above. This valve is chosen to insure that the controlled rectifiers will de-ionize. When this time will have been shortened by improving the technology of producing such devices the duration of the pulse can be reduced. The rapid decay of the pulse determines how rapidly the next voltage level is reached and is important in determining the maximum operating frequency. A practical limit to the rectangularity of the pulse is reached, however, when the voltage required to form the pulse is high enough to cause appreciable average power to flow in this circuit. Since this circuit is connected to the output load the impedance must necessarily be low.

The output of pulse-forming network 106 passes to output circuit bus 107 and therefrom to secondary 108 of pulse transformer 110, the other secondary terminal of which is connected to the control electrode of series-related controlled rectifier 112. The cathode of this rectifier is also connected to bus 107. The primary 109 of transformer 110 is connected to the anode of rectifier 112 and also to a shunt resistor 113—capacitor 114 combination to ground. Transformer 110 and shunt combination 113—114 comprise a gating circuit for controlled rectifier 112. This circuit receives energy from bus 208, this bus being connected to the cathodes of the positive-going controlled rectifiers 130 through 133. The circuit acts to turn on controlled rectifier 112 when the bus has been activated by controlled rectifiers 130 through 133.

A relatively large plurality of switch cores 115 through 128 are provided to act as controls for the several controlled rectifiers 130 through 137. Each switch core is provided with a drive winding, 139 through 152; a reset winding, 153 through 166; and an output winding 167 through 180. While these cores and windings may be of various detailed constructions we have employed a core that is commercially available for this purpose which has an outside diameter of ⅜″ and a ⅛″ by ⅛″ cross-section. Each drive winding was wound as a coil of 40 turns, each reset winding had the same number of turns but was wound on a different circumferential part of the core, while each output winding consisted of 10 turns and was wound on still another part of the core. It will be understood that a switch core is one that will transmit a pulse impressed upon the drive winding if the magnetic domains of the core have one orientation and will not so transmit a pulse if the domains have the opposite orientation. Which orientation the magnetic properties have depends upon the magnetic effect of the last pulse which influenced the core.

The pulses from pulse-forming network 106 are impressed upon the circuits connected to the drive windings of these cores. This is accomplished through resistor 182, which has a resistance of the order of 20,000 ohms, and through paralleled resistor 183—capacitor 184 combination. The latter resistor has a resistance of 220,000 ohms and the capacitor a capacitance in the range of from 0.1 to 1. microfarads. The complete circuit involved includes resistor 182, bus 208, switch core bus 202, diode 193, drive winding 145, and the resistor 183—capacitor 184 combination. The pulses from forming network 106 are referenced to ground and appear on bus 208 because controlled rectifier 112 is connected and is activated to conduct at all times that bus 208 is not a ground potential.

Each drive winding has a diode in series with it, being of opposite orientation of polarity in successive windings, and identified by numerals 187 through 200. These diodes are of small power capacity and are not of the controlled type. Diodes that each are capable of passing about 100 milliamperes in a 120 volt circuit have been satisfactory. The "computer type" are preferable, in that these have more desirable and more stable characteristics than ordinary inexpensive diodes.

The several reset windings are connected alternately seriezed; that is, windings 153, 155, 157, 159, 161, 163 and 165 are in one seriezed group and windings 154, 156, 158, 160, 164 and 166 are in the other seriezed group. Winding 154 is fed from the bus 202 at the left-hand or positive excursion side of the apparatus by a diode 204 poled to conduct when a positive pulse is obtained from bus 202. Diode 204 is of the usual type, similar to diode 188. Current limiting resistor 206, of 470 ohms resistance, is in series with it to the bus. In a symmetrical manner, diode 205 and resistor 207 connect to reset winding 165 at the right-hand or negative excursion side of our apparatus. The cathode of diode 205 is connected to the right-hand bus 209, however, which is the reverse connection to that of diode 204.

One terminal of the output winding of each switch core is connected to the cathode of the controlled rectifier with which it is associated. The other terminal of each output winding is connected to the control electrode of the main controlled rectifiers, either directly or through a small diode. It is understood that with the present state of the art silicon is the preferred semiconductor material for the controlled rectifiers. However, any other semiconductor or similar material as will give the controlling function, have a very small forward current resistance and a reverse potential capability in the hundred volts range is suitable.

For the "end" switch core structures and the controlled rectifier to which the output winding is connected, the connection is direct. In other words, one terminal of output winding 167 connects directly to the control electrode (slanting symbol) of controlled rectifier 130, and one terminal of output winding 180 connects directly to the control electrode of controlled rectifier 137.

For the intermediate switch core structures and the controlled rectifiers to which the output winding is connected, the connection is through a diode. These diodes, 212 through 223, are of the ordinary (or "computer") type previously described. Adjacent diodes, as 212 and 213, are connected cathode-to-cathode and the junction thereof is connected directly to the control electrode of a controlled rectifier, such as that of rectifier 131.

These are isolation diodes and are employed so that the pulses actuating the apparatus on the reduction of amplitude of the generated waveform will not interfere with the status of the circuits concerned with actuating the apparatus on the increasing amplitude portion of the waveform. Specifically, the output pulse from output winding 169 passes through diode 213 to the control electrode of controlled rectifier 131, but not into output winding 168 because of the blocking polarity of diode 212, and vice versa.

A capacitor is included in each return of each drive winding to the sources of prime direct current power. These capacitors are 225, 227, 229, 231, 233, 235, 237, 239, 241, 243, 245, 247 and 249. Each such capacitor is shunted by a resistor; i.e., 226, 228, 230, 232, 234, 236, 238, 240, 242, 244, 246, 248 and 250.

The capacitors are included to provide what is known as a "soft" reference voltage. The capacitance of the capacitors is such in relation to the energy of the pulses coming from the pulse-shaping network 106 that these pulses alter the magnetic domain status of the pulse transformers but do not cause an output to be obtained from the same by ordinary transformer action. In our embodiment of FIG. 8 a capacitance for each of capacitors 225, 227—etc. is of the order of one-quarter microfarad. This value is not altered as a requirement of the apparatus in order to obtain any operating frequency that is obtainable, but it should be altered if the width of the pulse from element 106 is changed considerably. The cores employed always have a fixed single current value, as 100 milliamperes, which causes the domains to change and the capacitance must be sufficiently large to allow that current to flow. This is a definite relation, but a variation with different core materials, etc. having a variation of three to one in characteristics will not require different capacitance values.

The value of each of the resistors in the group 226, 228—etc. previously recited is not critical. These are merely employed to discharge capacitors 225, 227—etc. in each case. A resistance value in the range of from not less than 15,000 ohms to not more than a few megohms will function.

The prime source of direct current power in FIG. 8 is represented as battery sections 252 through 255, series connected, on the left-hand side of the apparatus. These batteries are poled to give positive voltages with respect to ground to the anodes of controlled rectifiers 130 through 133. Battery section 252 provides the lowest voltage to rectifier 133 and the voltage sum of the sections, including that of section 255, provides the highest voltage to rectifier 130. On the right-hand side of the apparatus battery sections 257 through 260 provide prime energy. The positive terminal of battery 257 is connected to ground, as is the negative terminal of battery section 252, thus connecting the two groups in one continuous series. The negative terminal of section 257 provides a negative voltage to the cathode of controlled rectifier 134 as the lowest potential in the series chain. Battery section 260 provides the highest negative potential as the last in the series by connection to the cathode of controlled rectifier 137.

Resistor 263 is connected between ground 185 and anode bus 211 of the negative excursion controlled rectifiers and serves to maintain that bus at substantially ground potential when none of the controlled rectifiers are conducting. It is the duplicate of resistor 182, similarly connected to cathode bus 208 on the positive excursion controlled rectifiers.

Diode 264 is a protective diode, connected between the control electrode and the cathode of controlled rectifier 111 to protect the latter if a back voltage tends to be impressed upon the control electrode. Diode 264 is of the ordinary low power type previously described.

Capacitor 265 and resistor 266 form a parallel capacitor-resistor combination connected to diode 264 and to ground to form a gating pulse for turning on controlled rectifier 111 when the cathode of the latter is negative with respect to ground. In effect, this connects the gate to ground potential through a circuit that will not burn it out. A suitable value for capacitor 265 is not less than 0.001 microfarad and for resistor 266 not less than 20,000 ohms.

Controlled rectifier 112 will be recognized as in series with any (and all) of the positive excursion rectifiers 130 through 133 with respect to output bus 107, and controlled rectifier 111 as in series with respect to the negative excursion rectifiers 134 through 137. Rectifiers 111 and 112 are included to double the back-voltage capability of our apparatus and hence to double the power capable of being handled. That is, the prime power sources may have a voltage twice that of the rated back voltage of any of the rectifiers 130 through 137 because the back voltage on any of these is divided with either rectifier 111 or 112, as the case may be. It will be noted that we have doubled the power capability of our apparatus by adding only two rectifiers rather than by adding eight, that is, one in series with each of rectifiers 130 through 137. Of course, for definitely low voltage applications rectifiers 111 and 112 and the associated gating elements for the same may be omitted.

The circuit structure of FIG. 8 having been described, the mode of functioning thereof will now be treated.

We assume, as starting conditions, that controlled rectifier 105 was the last rectifier to be fired and that the step controlled-rectifier now conducting is element 132. We further assume that we are stepping upward in voltage, as from step 2 to step 4 in FIG. 2.

The operation proceeds with controlled rectifier 101 being fired by a pulse from multivibrator 100. The output of this rectifier passes through pulse-forming network 106 to output bus 107. This causes controlled rectifiers 112 and 132 to cease conducting. The pulse also appears on bus 202, associated with the switch cores. It reaches the same through a medium current diode 271, for example a 1N2157, which shunts controlled rectifier 112 in reverse polarity. This pulse is sufficiently positive to fire diode 189. This is because the pulse is more positive than the cathode of diode 189, which latter is returned to the junction between battery sections 253 and 254. Therefore, the switch core associated with diode 189; i.e., 117, is tripped and produces an output pulse that flows through isolating diode 213 and triggers controlled diode 131. This immediately raises the voltage of the output bus 208—107 from the positive voltage at battery section 253 to that at 254. Rectifier 132 is now back-biased (the cathode more positive than the anode) and so does not conduct. Rectifier 101 is also now back-biased and so ceases to conduct. This is because the voltage across the pulse-forming network 106 changes only slightly during this operation. Furthermore, the pulse present upon bus 202 will not fire controlled rectifier 130 because diode 187 is back-biased. It will also not fire controlled rectifier 133 or refire rectifier 132 because the corresponding switch cores are in the wrong magnetic state to allow this. Controlled rectifier 105 is now fired to discharge the pulse-forming network. This returns the apparatus to the starting conditions giving, however, the condition where one step more positive is conducting than before.

We now assume that controlled rectifier 105 has been the last rectifier fired, that step controlled-rectifier 132 is conducting and that we are stepping downward in voltage, as from one intermediate step to another lower one below the spike 22 of FIG. 2.

The operation begins again with controlled rectifier 101 being fired (from non-conduction to conduction between cathode and anode) by a pulse from multivibrator 100. (See FIG. 7). The output of this rectifier passes through pulse-forming network 106 into output bus 107 and also causes controlled rectifiers 112 and 132 to cease conducting, as before. The pulse again appears on bus 202 and again produces current flow through diode 189. However, switch core 117 is now in the wrong magnetic state to produce an output. Accordingly, controlled rectifier 132 remains cut-off because of the back-bias on its cathode by the pulse from the pulse-forming network. When this pulse begins to decay, the voltage decreases on both the output buses 107 and 208, as well as on bus 202. When this occurs a point is soon reached where diode 191 is forward biased. However, switch core 119 is also in the wrong magnetic state and so controlled rectifier 132 will not turn back on; i.e., it will not again conduct. The voltage continues to decay until diode 192 is forward biased and conducts. This occurs at approximately the positive voltage of battery section 252. Switch core 120 now trips and produces an output pulse through diode 216 to turn on controlled rectifier 133. Controlled rectifier 105 now fires to complete discharging pulse-forming network 106 and the change of step downward has been completed.

With the "top" controlled rectifiers 130 and 137 only a single switch core, 115 and 128 respectively, is connected to each trigger electrode rather than two switch cores, as for all other controlled rectifiers. This is because stepping toward reduced voltage the switch core would always have to be in a tripped state; thus, it is omitted.

For operation on the negative half cycle the functions of controlled rectifiers 101 and 105 are interchanged. This causes the step at ground potential to be of somewhat different width in the embodiment of FIG. 8 than the width of other steps.

The necessary means for reversing the magnetic state of the several switch cores is provided by the pulses which turn off controlled rectifiers 130 and 137. In the case of rectifier 130, the voltage of output buses 208 and 107 are at the maximum positive value; i.e., the positive voltage level of battery section 255. As has been described, this turn-off pulse from network 106 also appears on bus 202. It passes through resistor 206 and diode 204, then through the reset windings of half of the switch cores; that is, through reset windings 154, 156, 158, 160, 162, 164, and 166. It will be noted that this series circuit is returned to the full positive potential of battery section 255 by conductor 269. This provides a current pulse through these switch cores of proper polarity to set them for stepping down in voltage from the positive maximum of section 255 to the negative maximum of section 260.

When operation at controlled rectifier 137 is reached, a similar arrangement sets the other half of the switch cores for stepping up the voltage. That is, the cut-off pulse passes through resistor 207 and diode 205 and through reset windings 165, 163, 161, 159, 157, 155 and 153. This second series circuit is returned to full negative potential of battery section 260 by conductor 270.

In evaluating the two embodiments of FIGS. 5 and 8 it is to be noted that the maximum frequency of operation of the apparatus of FIG. 5 is approximately twice that of FIG. 8. This is because each stepping pulse of the former involves only the de-ionization time of one controlled rectifier, while in the latter the de-ionization time of either controlled rectifier 101 or 105 is required in addition to the de-ionization time of the particular controlled rectifier being rendered non-conducting. The maximum operating frequency is of the order of thousands of cycles per second with presently available practical controlled-rectifiers.

In an application where three steps up and three steps down is sufficient to produce an acceptable (half) sine wave, the maximum operating frequency is increased in inverse proportion to the number of steps.

When another waveshape is desired, such as a sawtooth, the rapid decay can be accomplished with one or two switching operations rather than the half of all operations required to bring a sine waveshape over a return half-cycle. Accordingly, the maximum frequency obtainable for such a waveshape is double that of the sine waveshape.

In order to alter the waveshape from that described to another waveshape it will be understood that only a change in "programming" of our apparatus is required. In FIG. 5 this is accomplished by changing the connections to the ring counter 32 from the rest of the apparatus. This is easily accomplished with a plug and jack panel known to the art.

Furthermore, in starting certain loads, such as resonant ones, we prefer to cause the first several cycles to be of reduced amplitude, as including only step 2, say, in FIG. 2. It is seen that this is easily accomplished by merely disconnecting the center of the sine waveform connections from the ring counter 32. Such a means of start up and stop can be made automatic by employing a time delay switch. When the "start apparatus" switch is closed by the operator, this closes only selected conductors between the ring counter and the controlled rectifiers; such as to energize controlled rectifiers 37, 36, 37, ground, 38, 39, 38, ground, and repeat. When these several cycles at reduced amplitude have been executed the time delay action closes the connections for all of the conductors and the full sine wave is produced. The stop switch is arranged to accomplish the reverse operation.

Another manner of accomplishing a reduced amplitude start and stop lies in providing similar time delay circuitry to reduce the supply voltage; i.e. the voltage of battery 46 or its equivalent, in FIG. 1.

One example of an application of this method is to be found in driving high power sonar loudspeakers from our apparatus. Such loudspeakers are invariably operated as resonant devices. With a gradual start undesired transients are reduced.

In FIG. 8 the change from the sinusoidal waveform producing apparatus shown to apparatus for producing other waveforms is accomplished by altering the output winding connections of the switch cores with respect to the control electrode of the controlled rectifier. For example, output winding 170 is not connected to the control electrode of controlled rectifier 132, but to rectifier 131 instead. This makes the voltage step then taken twice that taken with the prior connection.

As a further example, a sawtooth waveshape of nine ascending steps and a rapid fall is formed by making the following reconnections in FIG. 8. Cores 118, 120, 122, 124, 126, and 128 are disconnected. The output of core 116 is transferred to control rectifier 137.

The computer-like switch cores and associated elements can be altered in connection quickly for various waveshapes by programming with punched articles, as punched cards, and employing a punched card reader or equivalent. In this way one card determines one waveform and for the waveform desired at any particular time the correct card is merely inserted in the reader. Obviously, a sequence of automatically changed waveform, or waveform amplitudes, can be obtained by instructing the card reader to change cards at prearranged desired intervals.

For a gradual start-stop arrangement in FIG. 8 relay contacts are provided to transfer wire 269 to the positive terminal of battery section 253, transfer wire 270 to the negative terminal of battery 258, and break buses 202 and 209 beyond diode 191 and beyond diode 196, respectively. This makes diodes 187, 188, 189, 190 and 197, 198, 199, 200, respectively, inoperative. Rather than mechanical relay contacts electronic switches may be substituted.

A further alternate manner of driving the circuit of FIG. 8 to obtain various desired waveshapes merely requires that buses 202 and 209 be connected to a source of low power having the desired waveshape, rather than to buses 208 and 211. This provides a method and means for synchronizing one unit according to FIG. 8 with another such unit. This alternate operates in nearly the same manner as with pulse inputs at low and medium frequencies of operation, but at frequencies near the frequency limit of operation the waveform produced becomes somewhat "ragged." This is because of the fact that both voltage and time are stepped. That is, voltage transitions for synthesizing the waveform can occur only at certain times relative to the firing of controlled rectifiers 101 and 105.

In FIG. 8, also, for altering the synthesized waveshape, changing the return connection of the drive winding is as effective as changing both of the output winding connections of the switch core. This has the advantage of requiring that only half as many connections need be changed for a given circuit change.

Certain circuits intermediate between those of FIGS. 5 and 8 are also possible. One example is that wherein the lower third of FIG. 8 is combined with the right-hand third of FIG. 5. That is, the portion of FIG. 8 below and including buses 208 and 211 is combined with multivibrator 30, ring counter 32, and the auxiliary distribution circuits of FIG. 5. In particular, the control electrodes (the slanting lines) of the controlled rectifiers 130—137 are connected to the counter as in FIG. 5, to be turned on, and these rectifiers are turned off by means of controlled rectifiers 101 and 105, in the circuit of FIG. 8.

We have also determined that a binary counter may be employed in lieu of the ring counter 32 in FIG. 5. The binary counter functions in the circuit in the same manner as has been previously explained with respect to the ring counter.

It will be understood that even still further combinations of the elements and groups of elements previously described may be made to produce alternate embodiments of our invention and that need not be recited in detail because of the prior teaching of our specification.

FIG. 9 shows a modification of importance of the circuits of FIGS. 3 or 5. This includes an additional diode 280. This diode exercises a desirable effect with respect to the build up of current through inductor 281. Those elements in FIG. 9 that are the same as those in FIG. 3 have the same reference numerals as in FIG. 3. The new diode 280 is of the modest power capability of diode 15. Diode 280 is shunted directly across the inductor, now element 281, and the polarity is the same as that of diode 15. The additional diode is poled so as to allow current to flow more quickly upon this step of the apparatus being energized than when inductor 16 alone was present, as in FIG. 3. The inductor is, in effect, bypassed and so the slow buildup of current in an inductive circuit is avoided. Current must flow through the inductor so that when the step is de-energized the inductive kick is obtained. This does occur. Inductor 281 takes current as the current in the whole circuit continues to flow due to the voltage drop of the diode 280 in the forward direction; about one volt.

Capacitor 282 is connected between steps rather than being connected from a step to ground, and thus partakes of the structure of FIG. 5 rather than of FIG. 3. Because of the added diode 280 the value of inductor 281 can be of 50 microhenries rather than 100 microhenries as in FIG. 3. Thus, the connections detailed in FIG. 9 give the minimum sizes of capacitor 282 and inductor 281.

It will be understood that the power rating or the application to which our direct current to alternating current apparatus is put does not limit the scope of our invention. However, certain exemplary applications consist of driving sonar devices, driving servo and other motors, as a high power relatively high frequency for a sonic altimeter driver and for related types of apparatus.

In addition to high power batteries as a prime source of power, as in a submarine, banks of sun cells may be used. Where only alternating current of fixed frequency is available, as the ordinary power line, we prefer to employ one star-connected half-wave rectifier circuit with six semiconductor rectifiers and two small filter capacitors to obtain the direct current. Such a circuit gives both positive and negative voltages with respect to ground or any other such reference. It is desirable that any prime electrical energy source maintain relatively fixed voltages between taps thereon, as are used to feed the several steps of our ladder-like structure. Should a wide departure take place in this respect our apparatus would become inoperative. This concept gives rise to the terminology herein of "specific" voltages.

While the current through a load is often of prime interest, and in our output is an alternating current, it will be understood that an alternating voltage also appears across the load. This is the result of the systematic connection of one particular voltage from the prime electrical energy source to the load at any given instant of time and the voltage selected changed from instant to instant by the functioning of the controlled rectifiers.

While diodes have been shown and solid state such two terminal devices inferred in general it is to be understood that any type of unilateral (unidirectional) conductive elements may be used so long as these have at least approximately the characteristics of those specifically mentioned.

Although specific examples of voltages and values for the several circuit elements have been given in this specification to illustrate the invention, these are only by way of example and reasonably wide departures can be taken therefrom without departing from the inventive concept. Other modifications of the circuit elements, details of circuit connections and alteration of the coactive relation between elements may also be taken under our invention.

Having fully described our invention and the manner in which it is to be practiced, we claim:

1. A static device for forming alternating electrical energy from a source of series-connected elements adapted to simultaneously and continuously supply electrical energy at a plurality of fixed specific voltages comprising a controlled rectifier connected to one said voltage supply of said source, and to an output circuit, another controlled rectifier connected from a lower voltage supply of said source to said output circuit, pulse means to selectively initiate conduction of said controlled rectifiers, and inductive means to terminate said conduction by providing a voltage increment to back bias the controlled rectifier connected to the higher of the voltage supplies of said source.

2. Means for forming alternating electrical energy comprising a plurality of sources of electrical energy, each having a different specific value of voltage, a load circuit, a controlled rectifier connected to each said source of electrical energy, each said controlled rectifier having a control electrode, static means to produce electrical pulses for rectifier control, first means connected to said control electrodes and to said means to produce pulses to successively conductively connect said electrical energy sources of progressively higher values of voltage to said load circuit through said controlled rectifiers, and second means connected to said controlled rectifiers to successively conductively connect said sources of electrical energy of progressively lower values of voltage to said load circuit through the same said controlled rectifiers.

3. A device for synthesizing an alternating electrical energy waveform comprising a plurality of individual electrical energy sources from which said energy-waveform is formed series-connected to have in the sum different fixed values of voltage, a common load, a controlled solid state rectifier connected to each said electrical energy source, each said controlled rectifier having a control electrode, non-rotative means to produce repetitive electrical control pulses, first electrical means connected to said control electrodes and to said means to produce pulses to successively connect said electrical energy sources of progressively higher values of voltage to said common load through conduction in said controlled rectifiers, and second electrical means connected to said controlled rectifiers to successively connect said electrical energy sources of progressively lower values of voltage to said common load through conduction in the same said controlled rectifiers.

4. A device for synthesizing waves of alternating electrical energy comprising a plurality of power-supplying electrical energy sources having different invariable values of voltage, a common load, a controlled rectifier connected to each said electrical energy source, each said controlled rectifier having a control electrode, means to produce repetitive electrical control pulses, first inductive means connected to said control electrodes and to said means to produce pulses to successively connect said electrical energy sources of progressively higher values of voltage to said common load through said controlled rectifiers, and second inductive means connected to said controlled rectifiers to successively connect said electrical energy sources of progressively lower values of voltage to said common load through the same said controlled rectifiers by effectuating a back-bias thereon.

5. A device for synthesizing alternating electrical energy comprising a source of electrical energy having plural fixed voltage levels, a load circuit, plural rectifiers each having a control electrode, only one of said rectifiers connected to said source at each of the different voltage levels thereof, and to said load circuit, means connected to said control electrode to successively cause said rectifiers to conduct, an additional rectifier having a control electrode, said additional rectifier connected in series with said load and in series with each of said plural rectifiers, the control electrode of said additional rectifier connected to said means-to-successively-cause-said-rectifiers-to-conduct to cause said additional rectifier to conduct when each of said plural rectifiers conducts.

6. Means for forming alternating electrical energy comprising a source of invariable electrical energy having a plurality of potential levels, an output circuit, the same plurality of rectifiers each having a control electrode, said rectifiers connected to said source at different potential levels thereof and to said output circuit, means connected to said control electrode to successively trigger said rectifiers into conduction to pass current to said output circuit at different said potential levels, at least one additional rectifier having a control electrode, said additional rectifier connected in series with said load with respect to each of said plural rectifiers, the control electrode of said additional rectifier connected to said means to successively trigger to cause said additional rectifier to conduct each time any of said plural rectifiers conduct to enhance the power handling capability of said means for forming alternating electrical energy.

7. A device for synthesizing alternating electrical energy from a source having plural outputs of invariable voltage comprising a controlled rectifier connected between an output of said source and a circuit, a seriesed connection of a diode, an inductor and another controlled rectifier connected between another voltage output of said source and said circuit, a capacitor connected to said inductor and to said circuit, means connected to said controlled rectifiers to initate conduction thereof in a sequence; said inductor and capacitor proportioned to store a charge in said capacitor sufficient to terminate conduction of said controlled rectifier upon conduction being initiated in said other controlled rectifier.

8. An electrical device for commutating electrical energy from a source having multiple outputs of fixed voltage comprising a controlled rectifier connected between an output of said source and a utilization circuit, a diode, an inductor and another controlled rectifier connected in series between a lower voltage output of said source and said utilization circuit, a capacitor connected to the end of said inductor next to said other controlled rectifier; said source, capacitor and utilization circuit connected to a common return circuit; means connected to said controlled rectifiers to initiate conduction thereof in a prearranged sequence; said diode, inductor and capacitor proportioned to accumulate a charge in said capacitor sufficient to back-bias said controlled rectifier when conduction is initiated in said other controlled rectifier.

9. A device for forming alternating electrical energy from a source adapted to supply electrical energy at plural voltages comprising a controlled rectifier connected to one voltage supply of said source, and to an output circuit, a diode, an inductor and another controlled rectifier connected in series from a lower voltage supply of said source to said output circuit, a capacitor connected from the first-mentioned voltage supply to said inductor, a Zener diode connected across said capacitor, means to initiate conduction of said controlled rectifiers; said inductor and capacitor constituted to exceed the voltage of said first-mentioned voltage supply with the voltage of the charge upon said capacitor when said means to initiate conduction acts upon said other controlled rectifier.

10. A static device for forming alternating electrical energy from a source constituted to supply electrical energy at a plurality of specific voltages comprising a controlled rectifier connected to one said voltage supply of said source and to an output circuit, a diode, an inductor and another controlled rectifier connected in series from a lower voltage supply of said source to said output circuit, a capacitor connected from the first-mentioned voltage supply to the junction between said inductor and said other controlled rectifier, a Zener diode and means to limit the current through said Zener diode connected across said capacitor, means to initiate conduction of said controlled rectifiers; said inductor, capacitor and Zener diode constituted to cause a charge on said capacitor having a voltage exceeding by a fixed voltage increment the voltage of said first-mentioned voltage supply when said means to initiate conduction acts upon said other controlled rectifier.

11. Electrical means for passing alternating electrical energy to an output circuit from an electrical source having plural voltage steps comprising a first rectifier having electrodes including a control electrode, said first rectifier connected to a particular voltage step of said electrical source and to said output circuit, a first diode, inductor and second rectifier having electrodes including a control electrode, the last three recited elements connected in series between a lower voltage step of said electrical source and said output circuit, a capacitor connected between said first and said second rectifiers, and a second diode connected across said inductor; said second diode poled to pass current around said inductor upon the initiation of current flow in said series circuit, said inductor and capacitor constituted to terminate conduction of current through said first rectifier in order to subsequently provide conduction exclusively through said second rectifier.

12. Static electrical means for passing alternating electrical energy to a load circuit from an electrical source having plural fixed voltage increments comprising a first rectifier having electrodes and a control electrode, said first rectifier connected to a high value of said voltage increment of said electrical source, and to said load circuit, a first diode, inductor and second rectifier having electrodes and a control electrode, said first diode, inductor and second rectifier connected in series between a lower value of voltage of said electrical source and said load circuit, a capacitor connecting corresponding electrodes of said first and said second rectifiers, and a second diode connected across said inductor in the same polarity as said first diode in said series circuit; said second diode poled to pass current around said inductor upon the initiation of current flow in said series circuit, and said inductor and capacitor constituted to produce a back voltage upon the electrodes of said first rectifier to terminate conduction of current therethrough upon the initiation of conduction through said second rectifier to said load circuit for forming alternating electrical energy in said load circuit.

13. A device for forming an alternating electrical energy waveform comprising a plurality of electrical energy sources having different voltage values, a load circuit, a first rectifier having a control electrode, said first rectifier connected between a first of said sources and said load circuit, pulse means connected to the control electrode of said first rectifier to impress a first pulse of electrical energy upon said first rectifier; a diode, an inductor and a second rectifier having a control electrode, said second rectifier connected in series between another of said plurality of electrical energy sources having a different value of voltage than said first source, a capacitor connected to said inductor and the first of said sources; said pulse means connected to the control electrode of said second rectifier to impress a second pulse of electrical energy thereupon, said second pulse occurring later in time than said first pulse, the combination of said inductor and said capacitor acting to produce an additional voltage pulse in the second circuit of an amplitude greater than the voltage of said first source to cause said first rectifier to cease conducting.

14. Means to synthesize an alternating electrical energy waveform comprising a plurality of electrical energy sources having different values of absolute voltage, a common load, a first semiconductor rectifier having a control electrode, said first rectifier connected between a first of said sources of a particular voltage value and said load, a first pulse transformer connected to the control electrode of said first rectifier, an electronic counter to impress a first pulse of electrical energy upon said first pulse transformer, said counter connected to said first transformer; an inductor and a second semiconductor rectifier having a control electrode connected in series between another of said plurality of electrical energy sources having a lower value of voltage than said first source, a capacitor connected between the junction of said inductor and said second rectifier and the first of said sources, a second pulse transformer connected to the control electrode of said second rectifier and to said counter to impress a second pulse of electrical energy upon said second pulse transformer and the control electrode of said second rectifier, said second pulse occurring later in time than said first pulse, the combination of said inductor and said capacitor acting to produce an additional voltage pulse in the second circuit of an amplitude greater than the voltage of said first source and of a duration long enough to cause said first rectifier to cease conducting; successive further circuits composed according to the second group of circuit elements, each also connected to said load and actuated at later times by further pulses to the end that successive voltage levels are established across said load for particular intervals of time to cause an alternating current of quasi-sinusoidal waveshape to flow through said load.

15. Means to synthesize alternating electrical energy comprising static means to produce two series of pulses, only a pair of controlled rectifiers, one of said pair controlled by one said series of pulses and the other of said pair by the other of said series, circuit means to form shaped pulses of electrical energy from the output of said rectifiers, a plurality of controlled rectifiers, means to supply electrical energy to each of said plurality of rectifiers at a different voltage, only one output circuit, means to selectively control said plurality of controlled rectifiers from successive said shaped pulses to successively connect only one voltage of electrical energy to said output circuit to cause alternating electrical energy to flow therein as a consequence of successive recited events.

16. A static device to form alternating electrical energy from constant polarity electrical energy comprising a multiple source of constant polarity electrical energy, an output load, a plurality of controlled rectifiers, one said rectifier connected to each said multiple unit and to said output load, a static source of repetitive pulses, said source composed of oscillatory and delay means, a plurality of switch cores having windings, a winding of each of said switch cores connected to said source of pulses, another winding of each of said switch cores connected to initiate conduction of one of said rectifiers to repetitively establish mutually exclusive conducting states of said rectifiers to form an alternating electrical waveform.

17. A device to form alternating electrical energy from non-alternating electrical energy comprising a source of non-alternating electrical energy, having taps, an output load, a plurality of trigger-controlled diode rectifiers connected to said taps and to said output load, an all-electronic source of timed recurrent pulses, a plurality of switch cores having windings, a winding of each of said switch cores connected to said source of timed pulses, another winding of each of said switch cores connected to the trigger control of one said diode rectifier, and means to reset said switch cores connected to said load to reset said switch cores upon the voltage across said load reaching either a positive or a negative maximum, thereby to inaugurate a series of mutually exclusive conducting states of said diode rectifiers under the control of said timed pulses to form a stepped waveform from said voltage maximum to a voltage maximum of opposite polarity.

18. Means to form electrical energy of alternating amplitude from electrical energy of constant amplitude comprising seriesed-tandem electrical means to produce uniformly timed control pulses, a plurality of solid state rectifiers each having a control electrode, means to supply electrical energy to each of said plurality of rectifiers at a different constant voltage, a greater plurality of switch cores having windings than said plurality of rectifiers, a winding of a switch core connected to the control electrode of each said rectifier of said plurality, a diode connected to a winding of each said switch core to selectively accept said control pulses, a second diode connected to a further winding of each said switch cores to successively pass pulses occurring on output-voltage-increase operation and pulses occurring on output-voltage-decrease operation, and means to reset said switch cores upon the output voltage of said means to form alternating electrical energy reaching a maximum.

19. A device for synthesizing an alternating electrical energy waveform comprising static originating and delay means to produce two series of pulses timed to have the occurrence of pulses staggered between pulses of said series, plural controlled rectifiers, one of the same controlled by one said series of pulses and another by the other of said series, means to shape a pulse of electrical energy from the output of said controlled rectifiers, a second and larger plurality of controlled rectifiers, means to supply electrical energy to each of said second plurality of rectifiers at a different voltage, a plurality of switch cores having windings, at least one winding of one switch core connected to the control electrode of each said rectifier of said second plurality, a unidirectional conductive element connected to a winding of each said switch core to establish an energization routine therefor, a second unidirectional conductive element connected to a further winding of said plurality of switch cores to separate pulses occurring on operation to increase output voltage from pulses occurring on operation to decrease output voltage, means to provide a soft reference to said switch cores connected to a winding thereof, and means to reset said switch cores upon the output voltage of said device for synthesizing reaching a maximum amplitude.

20. Means to synthesize an alternating electrical energy waveform comprising exclusively electrical means to produce two series of electrical pulses with the time of pulse occurrence staggered equally between pulses of each series, a pair of controlled semiconductor rectifiers, the electrical conduction of one of said pair controlled by one said series of pulses and of the other of said pair by the other of said series, means to shape further pulses of electrical energy from the output of one of said pair of rectifiers, a plurality of controlled semiconductor rectifiers each having a control electrode, means to supply electrical energy to each of said plurality of rectifiers at a different fixed voltage, a greater plurality of switch cores having windings than said plurality of rectifiers, at least one winding of one switch core connected to the control electrode circuit of each said rectifier of said plurality, a diode connected to a winding of each said switch core to establish an energization routine therefor, a second diode connected to a further winding of most of said switch cores to separate said further pulses occurring upon operation to increase output voltage from said further pulses occurring upon operation to decrease output voltage, a capacitor to provide a soft voltage reference to said switch cores connected to a winding thereof, and circuit means to reset said switch cores upon the output voltage of said means-to-synchronize reaching a maximum amplitude of either polarity electrically.

21. Means for forming alternating electrical energy comprising an electrical energy source to supply electrical energy at plural voltage levels, plural rectifiers each having conduction control means, said rectifiers connected to said source at various voltage levels, a counter connected to each said control means to initiate conduction of one said rectifier at one said voltage level, further controlled rectifiers, pulse-forming means, plural pulse transformers, said further controlled rectifiers connected to said counter and to said pulse-forming means, said pulse transformers connected to said pulse-forming means and to each said plural rectifier to successively distribute pulses to successive said plural rectifiers to terminate the electrical conduction thereof according to the waveform of alternating electrical energy to be formed by said means-for-forming alternating electrical energy.

22. A device for synthesizing alternating electrical energy comprising an electrical energy source to supply the power for said device, said source constituted to supply electrical energy at plural voltage levels, plural controlled rectifiers, each having electrical conduction control means, one of said plural rectifiers connected to said source at each of said voltage levels, a counter connected to each said control means to successively initiate conduction of one said rectifier at only one said voltage level, further controlled rectifiers, a pulse-forming network, plural pulse transformers, said further rectifiers connected to said counter and to said pulse-forming network to produce a pulse constituted and timed to terminate conduction of each said plural rectifier, said pulse transformers connected to said pulse-forming network and to each said plural rectifier to distribute said pulse to the proper said plural rectifier at the proper time for terminating the electrical conduction thereof according to the time variation of said alternating electrical energy.

23. The device of claim 22 in which said counter is a ring counter.

24. The device of claim 22 in which said counter is a binary counter.

References Cited in the file of this patent

UNITED STATES PATENTS

| | | |
|---|---|---|
| 1,691,986 | Nyquist | Nov. 20, 1928 |
| 1,997,644 | Long | Apr. 16, 1935 |
| 2,602,918 | Kretzmer | July 8, 1952 |
| 2,668,188 | Naslund | Feb. 2, 1954 |
| 2,719,225 | Morris | Sept. 27, 1955 |

FOREIGN PATENTS

| | | |
|---|---|---|
| 762,081 | Germany | June 8, 1954 |

OTHER REFERENCES

"Solid-State Thyratron Switches Kilowatts" by R. P. Frenzel and F. W. Gutzwiller; published by Electronics (March 28, 1958).